US012620816B2

(12) United States Patent (10) Patent No.: US 12,620,816 B2
Onuki (45) Date of Patent: May 5, 2026

(54) BATTERY TYPE DETERMINATION SYSTEM, METHOD FOR DETERMINING BATTERY TYPE, AND STORAGE MEDIUM

(71) Applicant: HONDA MOTOR CO., LTD., Tokyo (JP)

(72) Inventor: Yasumichi Onuki, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 646 days.

(21) Appl. No.: 18/109,894

(22) Filed: Feb. 15, 2023

(65) Prior Publication Data

US 2023/0318313 A1     Oct. 5, 2023

(30) Foreign Application Priority Data

Mar. 31, 2022     (JP) ................................. 2022-059098

(51) Int. Cl.
 *H01M 10/44*         (2006.01)
 *G01R 23/00*         (2006.01)
         (Continued)
(52) U.S. Cl.
 CPC .............. *H02J 7/47* (2026.01); *G01R 23/005* (2013.01); *G01R 31/389* (2019.01); *H01M 10/4285* (2013.01)
(58) Field of Classification Search
 CPC .. H02J 7/00045; H02J 7/0047; H02J 7/00032; H02J 7/47; G01R 23/005;
         (Continued)

(56) References Cited

U.S. PATENT DOCUMENTS

2009/0212736 A1     8/2009   Baarman et al.
2016/0133387 A1 *   5/2016   Kanno ..................... H01G 7/06
                                                             307/109

FOREIGN PATENT DOCUMENTS

EP          2206215 B1 * 12/2015   ............ H01M 10/44
JP      H08-255636        10/1996
                (Continued)

OTHER PUBLICATIONS

Japanese Office Action for Japanese Patent Application No. 2022-059098 mailed Jan. 9, 2024.

*Primary Examiner* — Edward Tso
(74) *Attorney, Agent, or Firm* — Amin, Turocy & Watson, LLP

(57)         ABSTRACT
A battery type determination system includes an electric circuit connected to a battery, and a battery type determination device that determines a type of the battery on the basis of a characteristic value of the electric circuit. The electric circuit includes an AC power supply having a variable frequency, and a capacitor circuit. The battery type determination device includes a resonance state detection unit that detects at least one resonance state in response to an AC signal output from the AC power supply, a resonance frequency detection unit that detects a resonance frequency in the resonance state, a resonance characteristic detection unit that uses the resonance frequency as a resonance characteristic of the battery, and a determination unit that determines whether or not the battery is of the same type as a reference battery by comparing the resonance characteristic of the battery with a reference resonance characteristic of the reference battery serving as a reference for the battery.

9 Claims, 12 Drawing Sheets

(51) Int. Cl.

| | | |
|---|---|---|
| *G01R 31/389* | (2019.01) | |
| *H01M 10/42* | (2006.01) | |
| *H01M 10/46* | (2006.01) | |
| *H02J 7/47* | (2026.01) | |

(58) Field of Classification Search
CPC .. G01R 31/389; G01R 31/382; G01R 31/385;
H01M 10/48; H01M 10/44; H01M
10/4285
USPC ................ 320/107, 132, 134, 136, 149, 106
See application file for complete search history.

(56) References Cited

FOREIGN PATENT DOCUMENTS

| | | | | |
|---|---|---|---|---|
| JP | H11-260422 | 9/1999 | | |
| JP | 2009-005426 | 1/2009 | | |
| JP | 2010-246219 | 10/2010 | | |
| JP | 2010246219 A * | 10/2010 | | |
| JP | U-B-3163260 | 10/2010 | | |
| JP | 2011-514129 | 4/2011 | | |
| JP | 2012-055043 | 3/2012 | | |
| JP | 2014-239650 | 12/2014 | | |
| JP | 2017-041111 | 2/2017 | | |
| JP | 2019-190939 | 10/2019 | | |
| WO | WO-2009105595 A2 * | 8/2009 | .......... | H02J 7/00036 |
| WO | 2015/133068 | 9/2015 | | |

* cited by examiner

FIG. 6

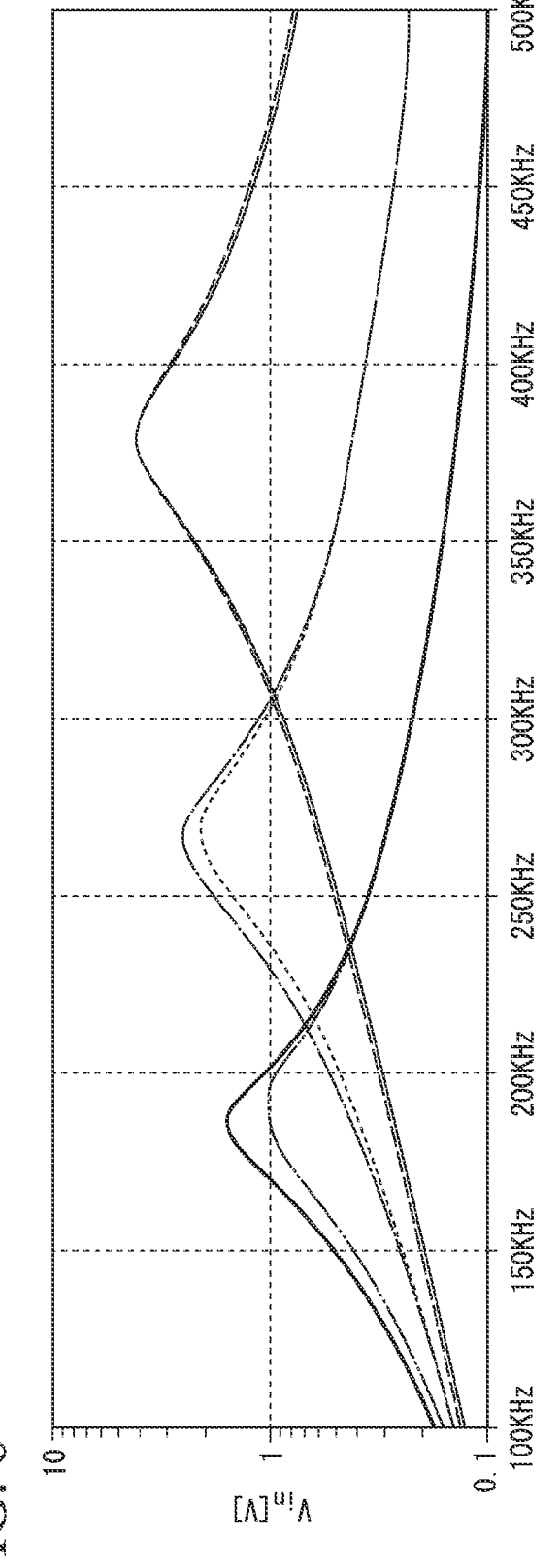

FREQUENCY OF AC CURRENT

SWITCH 122-2 OFF, SWITCH 122-3 OFF, FREQUENCY CHARACTERISTIC OF MEASURED BATTERY

SWITCH 122-2 OFF, SWITCH 122-3 OFF, FREQUENCY CHARACTERISTIC OF REFERENCE BATTERY

SWITCH 122-2 ON, SWITCH 122-3 OFF, FREQUENCY CHARACTERISTIC OF MEASURED BATTERY

SWITCH 122-2 ON, SWITCH 122-3 OFF, FREQUENCY CHARACTERISTIC OF REFERENCE BATTERY

SWITCH 122-2 ON, SWITCH 122-3 ON, FREQUENCY CHARACTERISTIC OF MEASURED BATTERY

SWITCH 122-2 ON, SWITCH 122-3 ON, FREQUENCY CHARACTERISTIC OF REFERENCE BATTERY

BATTERY TYPE DETERMINATION SYSTEM, METHOD FOR DETERMINING BATTERY TYPE, AND STORAGE MEDIUM

CROSS-REFERENCE TO RELATED APPLICATION

Priority is claimed on Japanese Patent Application No. 2022-059098, filed Mar. 31, 2022, the content of which is incorporated herein by reference.

BACKGROUND OF THE INVENTION

Field of the Invention

The present invention relates to a battery type determination system, a method for determining a battery type, and a storage medium.

Description of Related Art

In known techniques, a method for identifying a type of a battery on the basis of a DC internal resistance during charging of the battery and a DC internal resistance during discharging thereof is known (see, for example, PCT International Publication No. WO 2015/133068). In such a method, the type of the battery is determined by attaching a resistor having a predetermined resistance value to the battery and measuring the resistance value at the time of identification. There is also a method for attaching an IC chip to a battery to determine a type of the battery on the basis of an identification signal output by the IC chip.

SUMMARY OF THE INVENTION

However, in known techniques, it is necessary to attach a component such as a resistor or IC chip to a battery, and thus costs are incurred. In addition, if these components are counterfeited, they are attached to an unintended battery, which makes it impossible to correctly identify a battery type.

Aspects of the present invention have been made in consideration of such circumstances, and one of objects thereof is to determine a battery type without attaching an identification component.

In order to solve the above problems and achieve the objects, the present invention adopts the following aspects.

(1) A battery type determination system according to an aspect of the present invention includes an electric circuit connected to a battery, and a battery type determination device that determines a type of the battery on the basis of a characteristic value of the electric circuit. The electric circuit includes an AC power supply that is connected to the battery and has a variable frequency, and a capacitor circuit that is configured of at least one capacitor and provided between the battery and the AC power supply. The battery type determination device includes a resonance state detection unit that detects at least one resonance state generated by an inductance component of the battery and a capacitance component of the capacitor circuit in response to an AC signal output from the AC power supply, a resonance frequency detection unit that detects a resonance frequency in the resonance state, a resonance characteristic detection unit that uses the resonance frequency as a resonance characteristic of the battery, and a determination unit that determines whether or not the battery is of the same type as a reference battery by comparing the resonance characteristic of the battery with a reference resonance characteristic of the reference battery serving as a reference for the battery.

(2) In the above aspect (1), the battery type determination device may further include a resonance current detection unit that detects a magnitude of a resonance current, which is a current when a frequency of the AC signal is the resonance frequency, with respect to an AC voltage of the AC signal, and the resonance characteristic detection unit may use the resonance current as the resonance characteristic of the battery.

(3) In the above aspect (1), the battery type determination device may further include a resonance voltage detection unit that detects a magnitude of a resonance voltage, which is a voltage when the frequency is the resonance frequency, with respect to the AC voltage of the AC signal, and the resonance characteristic detection unit may use the resonance voltage as the resonance characteristic of the battery.

(4) In any one of the above aspects (1) to (3), the capacitor circuit may be a variable capacitor having a variable capacitance, and the determination unit may determine whether or not the battery is of the same type as the reference battery by comparing the resonance characteristic of the battery for each different capacitance of the variable capacitor with the reference resonance characteristic of the reference battery.

(5) In the above aspect (4), the variable capacitor may be configured of capacitors connected in parallel with each other and switches connected to the capacitors.

(6) In any one of the above aspects (1) to (3), the capacitor circuit may be configured of a first capacitor connected in parallel with the battery with respect to the AC power supply and a second capacitor connected in series with the battery and the first capacitor with respect to the AC power supply.

(7) In any one of the above aspects (1) to (3), the capacitor circuit may be configured of a first capacitor connected in parallel with the battery with respect to the AC power supply and a second capacitor connected in series with the battery with respect to the AC power supply and connected in parallel with the first capacitor.

(8) A method for determining a battery type according to an aspect of the present invention includes: a resonance state detecting step of detecting at least one resonance state generated by an inductance component of a battery and a capacitance component of a capacitor circuit in response to an AC signal output from an AC power supply in an electric circuit, which includes the AC power supply that is connected to the battery and has a variable frequency, and a capacitor circuit that is configured of at least one capacitor and provided between the battery and the AC power supply: a resonance frequency detecting step of detecting a resonance frequency in the resonance state; a resonance characteristic detecting step of using the resonance frequency as a resonance characteristic of the battery; and a determining step of determining whether or not the battery is of the same type as a reference battery by comparing the resonance characteristic of the battery with a reference resonance characteristic of the reference battery serving as a reference for the battery.

(9) A storage medium according to an aspect of the present invention stores a program that causes a computer to execute: detecting at least one resonance state generated by an inductance component of a battery and a capacitance component of a capacitor circuit in response to an AC signal output from an AC power supply in an electric circuit, which includes the AC power supply that is connected to the battery and has a variable frequency, and a capacitor circuit that is configured of at least one capacitor and provided between the battery and the AC power supply: detecting a resonance frequency in the resonance state: using the resonance frequency as a resonance characteristic of the battery; and determining whether or not the battery is of the same type as a reference battery by comparing the resonance characteristic of the battery with a reference resonance characteristic of the reference battery serving as a reference for the battery.

According to the aspects (1) to (3), (8), and (9), the battery type can be determined without attaching an identification component.

According to the aspects (4) to (7), the battery type can be determined with higher accuracy.

BRIEF DESCRIPTION OF THE DRAWINGS

FIG. 6 is a diagram showing frequency characteristics of a measured battery and frequency characteristics of a reference battery.

DETAILED DESCRIPTION OF THE INVENTION

Embodiments of a battery type determination system of the present invention will be described below with reference to the drawings.

Figure 1:
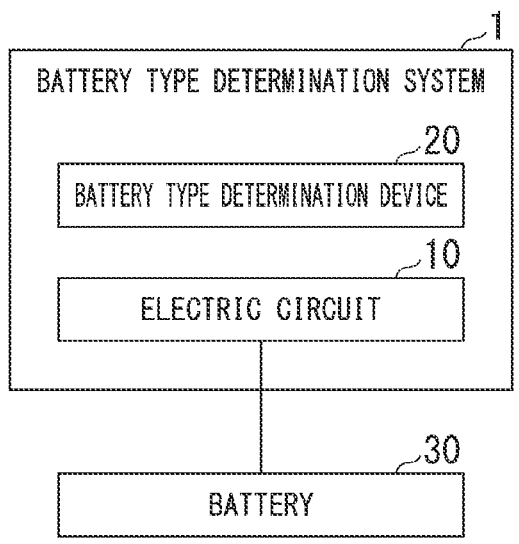
FIG. 1 is a diagram showing a battery type determination system.

FIG. 1 is a diagram showing a battery type determination system 1. The battery type determination system 1 determines a type of a connected battery 30. The battery type determination system 1 includes an electric circuit 10 and a battery type determination device 20. The electric circuit 10 is connected to the battery 30. The battery type determination device 20 determines the type of the battery 30 on the basis of a characteristic value of the electric circuit 10.

Figure 2:
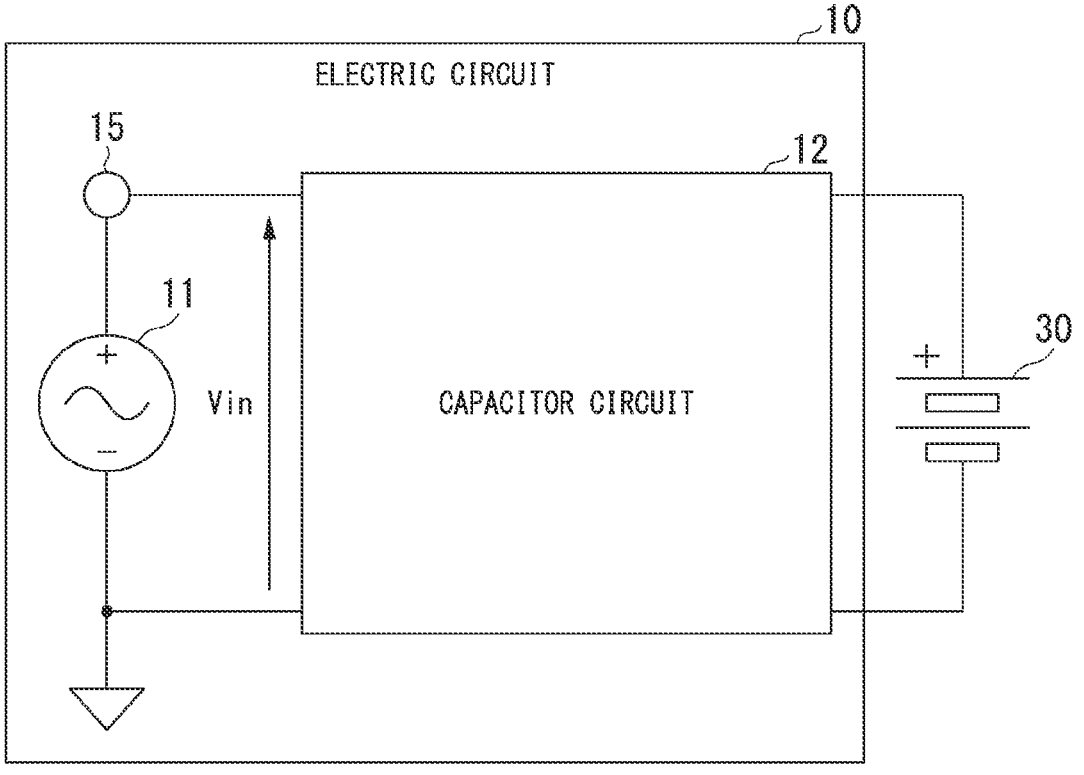
FIG. 2 is a diagram showing a configuration of an electric circuit.

FIG. 2 is a diagram showing a configuration of the electric circuit 10. The electric circuit 10 includes an AC power supply 11, a capacitor circuit 12, and a sensor 15. The AC power supply 11 is connected to the battery 30. A frequency output by the AC power supply 11 is variable. The capacitor circuit 12 is configured of at least one capacitor and provided between the battery 30 and the AC power supply 11. The sensor 15 measures a magnitude of a current output from the AC power supply 11 or a magnitude of a voltage boosted by the AC power supply 11. For example, the AC power supply 11 changes a frequency of the output current and the magnitude of the boosted voltage to output a current having a constant magnitude. The AC power supply 11 may change the frequency of the output current and change the magnitude of the current to boost a voltage having a constant magnitude. A specific configuration of the capacitor circuit 12 will be described later. By changing the frequency of the current output by the AC power supply 11, an inductance component and a resistance component of the battery 30 change, and thus frequency characteristics of an impedance of the battery 30 and a simulated circuit approximated by a general inductor element and resistor element do not match. In addition, due to the change in frequency, an impedance of the entire circuit changes due to the inductance component and the resistance component of the battery 30 and a capacitance component of the capacitor circuit 12. Thus, resonance of the circuit is observed.

Figure 3:
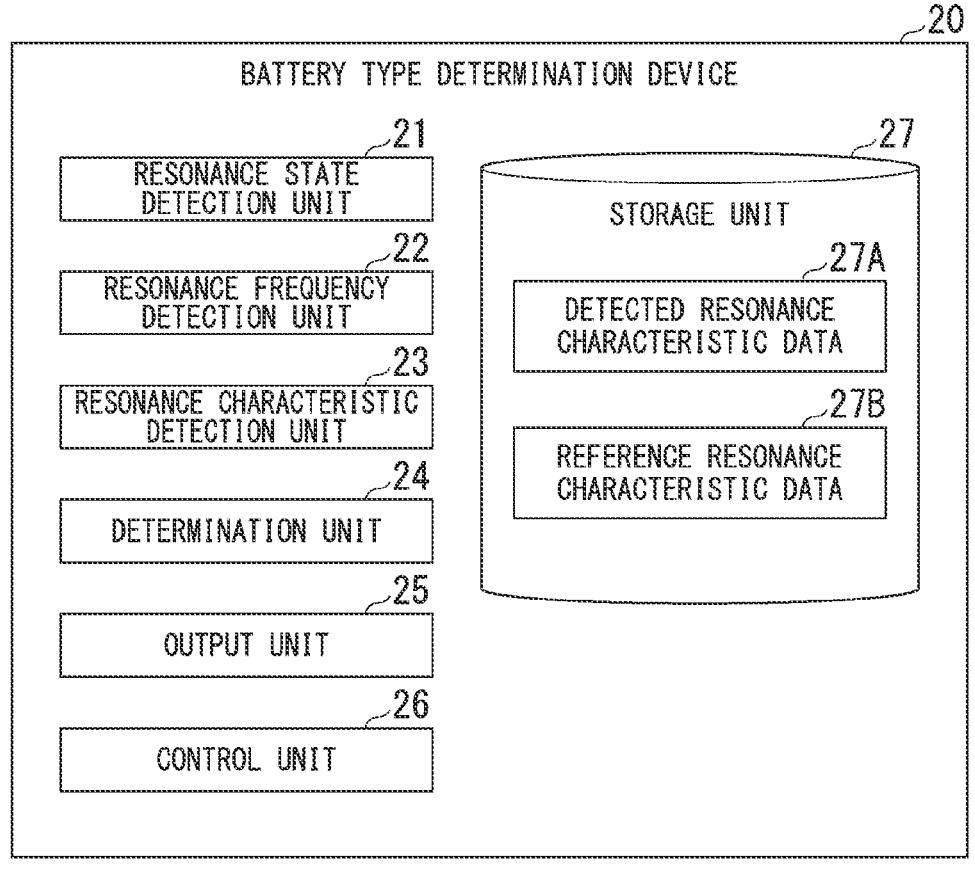
FIG. 3 is a diagram showing a configuration of a battery type determination device.

FIG. 3 is a diagram showing a configuration of the battery type determination device 20. The battery type determination device 20 includes a resonance state detection unit 21, a resonance frequency detection unit 22, a resonance characteristic detection unit 23, a determination unit 24, an output unit 25, a control unit 26, and a storage unit 27. The storage unit 27 stores detected resonance characteristic data 27A and reference resonance characteristic data 27B. These constituent elements are realized by a hardware processor such as a central processing unit (CPU) executing a program (software). Some or all of these constituent elements may be realized by hardware (a circuit unit; including circuitry) such as a large scale integration (LSI), an application specific integrated circuit (ASIC), a field-programmable gate array (FPGA), and a Graphics Processing Unit (GPU), or may be realized by software in cooperation with hardware. The program may be stored in advance in a storage device (a storage device including a non-transitory storage medium) such as a hard disk drive (HDD) or a flash memory, or may be stored in a removable storage medium (a non-transitory storage medium) such as a DVD or CD-ROM and installed by loading the storage medium into a drive device.

The resonance state detection unit 21 detects at least one resonance state generated by the inductance component of the battery 30 and the capacitance component of the capacitor circuit 12 with respect to an AC signal output from the AC power supply 11. The AC signal is, for example, an AC current or an AC voltage. For example, the resonance state detection unit 21 acquires the frequency of the current output by the AC power supply 11 and the magnitude of the current or voltage measured by the sensor 15 and creates data of frequency characteristics of the current or voltage to detect the at least one resonance state.

The resonance frequency detection unit 22 detects a resonance frequency in the resonance state. The resonance characteristic detection unit 23 uses the resonance frequency detected by the resonance frequency detection unit 22 as a resonance characteristic of the battery 30. The detected resonance characteristic is recorded in the storage unit 27 as the detected resonance characteristic data 27A.

The determination unit 24 compares the detected resonance characteristic data 27A with the reference resonance characteristic data 27B stored in the storage unit 27 and determines whether or not the battery 30 is a reference battery. The reference resonance characteristic data 27B is resonance characteristic data created from the reference battery by the electric circuit 10, the resonance state detection unit 21, the resonance frequency detection unit 22, and the resonance characteristic detection unit 23. The reference battery is a battery that serves as a criterion for determination and is assumed to be a battery of the same type as the battery 30, for example. If the battery 30 connected to the electric circuit 10 and the reference battery are of the same type, the detected resonance characteristic data 27A and the reference resonance characteristic data 27B coincide with each other. If the battery connected to the electric circuit 10 and the reference battery are of different types, the detected resonance characteristic data 27A and the reference resonance characteristic data 27B do not coincide with each other. In a case in which the two pieces of resonance characteristic data coincide with each other, the determination unit 24 determines that the battery 30 is of the same type as the reference battery. In a case in which the two pieces of resonance characteristic data do not coincide with each other, the determination unit 24 determines that the battery 30 is of a different type from the reference battery. For example, when a difference between resonance frequencies included in the two pieces of resonance characteristic data is equal to or less than a predetermined value, the determination unit 24 determines that the two pieces of resonance characteristic data coincide with each other, and when greater than the predetermined value, it determines that the two pieces of resonance characteristic data do not coincide with each other. The storage unit 27 may have a plurality of pieces of different reference resonance characteristic data 27B of different reference batteries, and the determination unit 24 may perform determination on each of the reference resonance characteristic data 27B.

The output unit 25 outputs determination results obtained by the determination unit 24. The output determination results are input to, for example, an external display device, and the determination results are displayed.

The control unit 26 controls the electric circuit 10. The control unit 26 controls the frequency of the current output by the AC power supply 11. Further, the control unit 26 controls the magnitude of the voltage so that magnitudes of currents output by the AC power supply 11 are equal to each other.

The battery type determination device 20 may include a resonance current detection unit 28 that detects a magnitude of a resonance current, which is a current when the frequency is the resonance frequency. The resonance characteristic detection unit 23 may use the resonance current as the resonance characteristic of the battery 30. The determination unit 24 may determine that the two pieces of resonance characteristic data coincide with each other when the resonance frequencies and the resonance currents included in the two pieces of resonance characteristic data coincide with each other. For example, when a difference between magnitudes of the resonance currents is equal to or less than a predetermined value, the determination unit 24 determines that the resonance currents coincide with each other, and when greater than the predetermined value, it determines that the resonance currents do not coincide with each other.

The battery type determination device 20 may include a resonance voltage detection unit 29 that detects a magnitude of a resonance voltage, which is a voltage when the frequency is the resonance frequency. The resonance characteristic detection unit 23 may use the resonance voltage as the resonance characteristic of the battery 30. The determination unit 24 may determine that the two pieces of resonance characteristic data coincide with each other when the resonance frequencies and the resonance voltages included in the two pieces of resonance characteristic data coincide with each other. For example, when a difference between the magnitudes of the resonance voltages is equal to or less than a predetermined value, the determination unit 24 determines that the resonance voltages coincide with each other, and when greater than the predetermined value, the determination unit 24 determines that the resonance voltages do not coincide with each other.

The resonance characteristics may include three characteristics of the resonance frequency, the resonance current, and the resonance voltage, and the determination unit 24 may determine the type of the battery 30 on the basis of the three characteristics. Further, the determination unit 24 may determine the type of the battery 30 on the basis of only the resonance current or only the resonance voltage.

In the following description, the battery type determination device 20 does not include the resonance current detection unit 28 and the resonance voltage detection unit 29 for the sake of simplicity, but they may be appropriately provided similarly to the resonance frequency detection unit 22.

Figure 4:
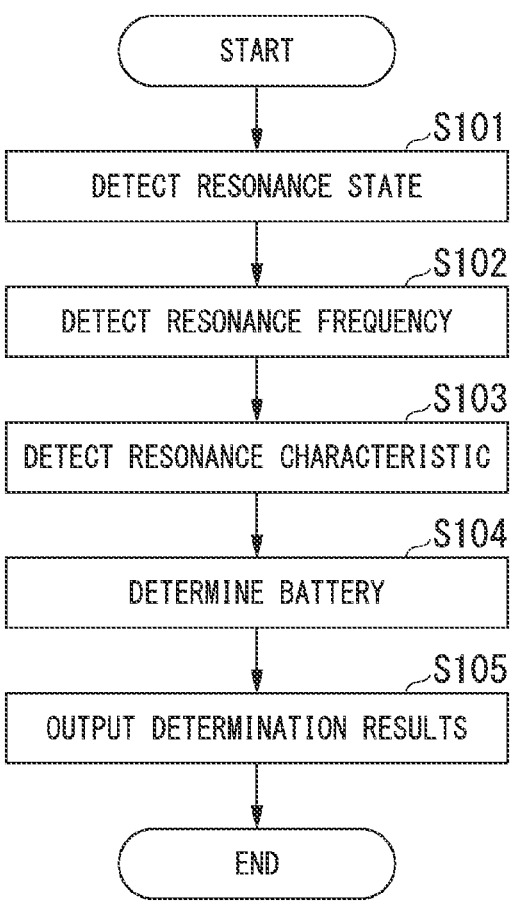
FIG. 4 is a flowchart showing an operation example of the battery type determination device.

FIG. 4 is a flowchart showing an operation example of the battery type determination device 20. The resonance state detection unit 21 detects at least one resonance state (step S101). The resonance frequency detection unit 22 detects the resonance frequency in the resonance state (step S102). The resonance characteristic detection unit 23 uses the resonance frequency detected by the resonance frequency detection unit 22 as the resonance characteristic of the battery 30 (step S103). The determination unit 24 determines whether or not the battery 30 is of the same type as the reference battery (step S104). The output unit 25 outputs the determination results obtained by the determination unit 24 (step S105).

First Embodiment

Figure 5:
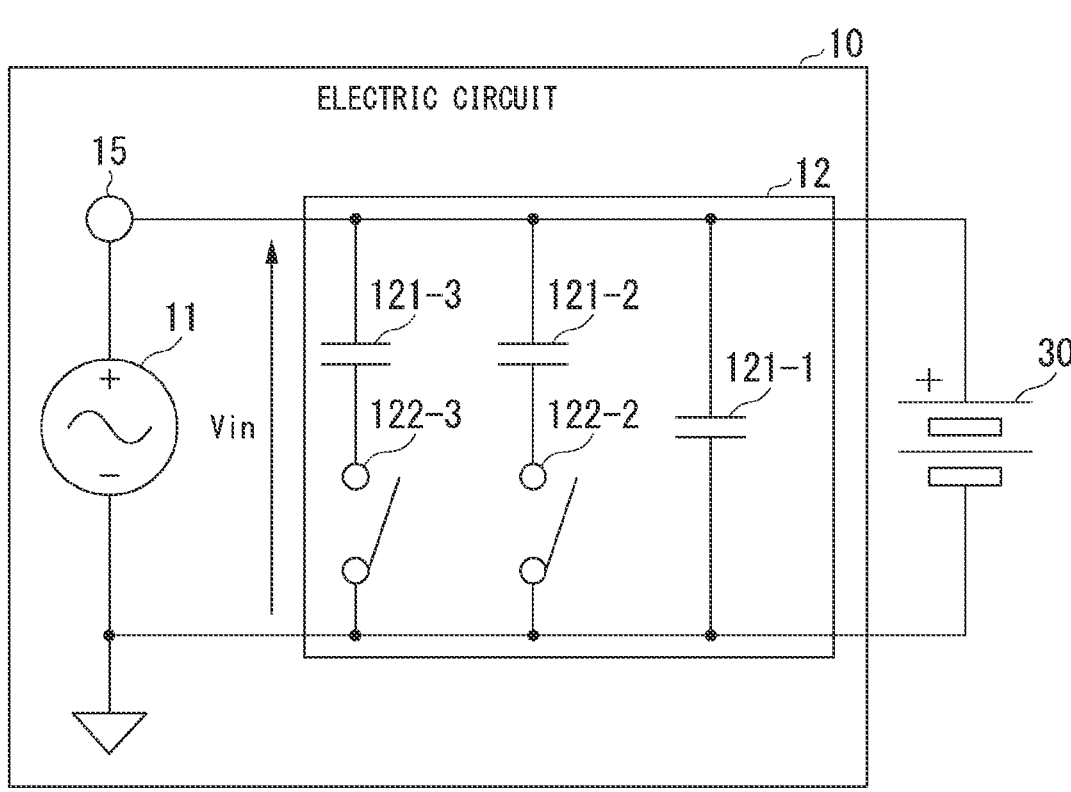
FIG. 5 is a diagram showing an example of an electric circuit according to a first embodiment.

The capacitor circuit 12 according to a first embodiment is a variable capacitor whose capacitance is variable. The capacitor circuit 12 is configured of, for example, capacitors 121 connected in parallel with each other and switches 122 connected to the capacitors 121. FIG. 5 is a diagram showing an example of the electric circuit 10 according to the first embodiment. In the capacitor circuit 12, capacitors 121-1, 121-2, and 121-3 are connected in parallel with each other, a switch 122-2 is connected to the capacitor 121-2, and a switch 122-3 is connected to the capacitor 121-3. A capacitance of the capacitor circuit 12 is changed by turning the switches 122-2 and 122-3 on or off. The switches 122-2 and 122-3 are controlled by the control unit 26 of the battery type determination device 20, for example.

In the first embodiment, the resonance state detection unit 21 detects different resonance states for different capacitances of the capacitor circuit 12. In the first embodiment, the resonance frequency detection unit 22 detects a resonance frequency for each resonance state. In the first embodiment, the determination unit 24 compares the resonance frequency for each resonance state included in the detected resonance characteristic data 27A with the resonance frequency for each resonance state included in the reference resonance characteristic data 27B and determines that battery 30 is of the same type as the reference battery in a case in which all of them coincide with each other.

FIG. 6 is a diagram showing frequency characteristics of the measured battery 30 and frequency characteristics of the reference battery. Three resonance states are detected by switching the switches 122-2 and 122-3 in three ways such as turning both off, turning the switch 122-2 on and the switch 122-3 off, and turning both on, thereby changing the capacitance of the capacitor circuit 12. The battery 30 is a simulated circuit whose resonance frequency coincides with that of the reference battery when both of the switches 122-2 and 122-3 are turned off. That is, the graph shown in FIG. 6 is for the case in which a battery different from the reference battery is connected to the electric circuit 10.

The resonance frequencies when the switch 122-2 is turned on and the switch 122-3 is turned off, and both are turned on do not coincide with the resonance frequency of the reference battery to which the capacitance of capacitor circuit 12 corresponds. Accordingly, the determination unit 24 determines that the battery 30 (simulated circuit) is of a different type from the reference battery.

Figure 7:
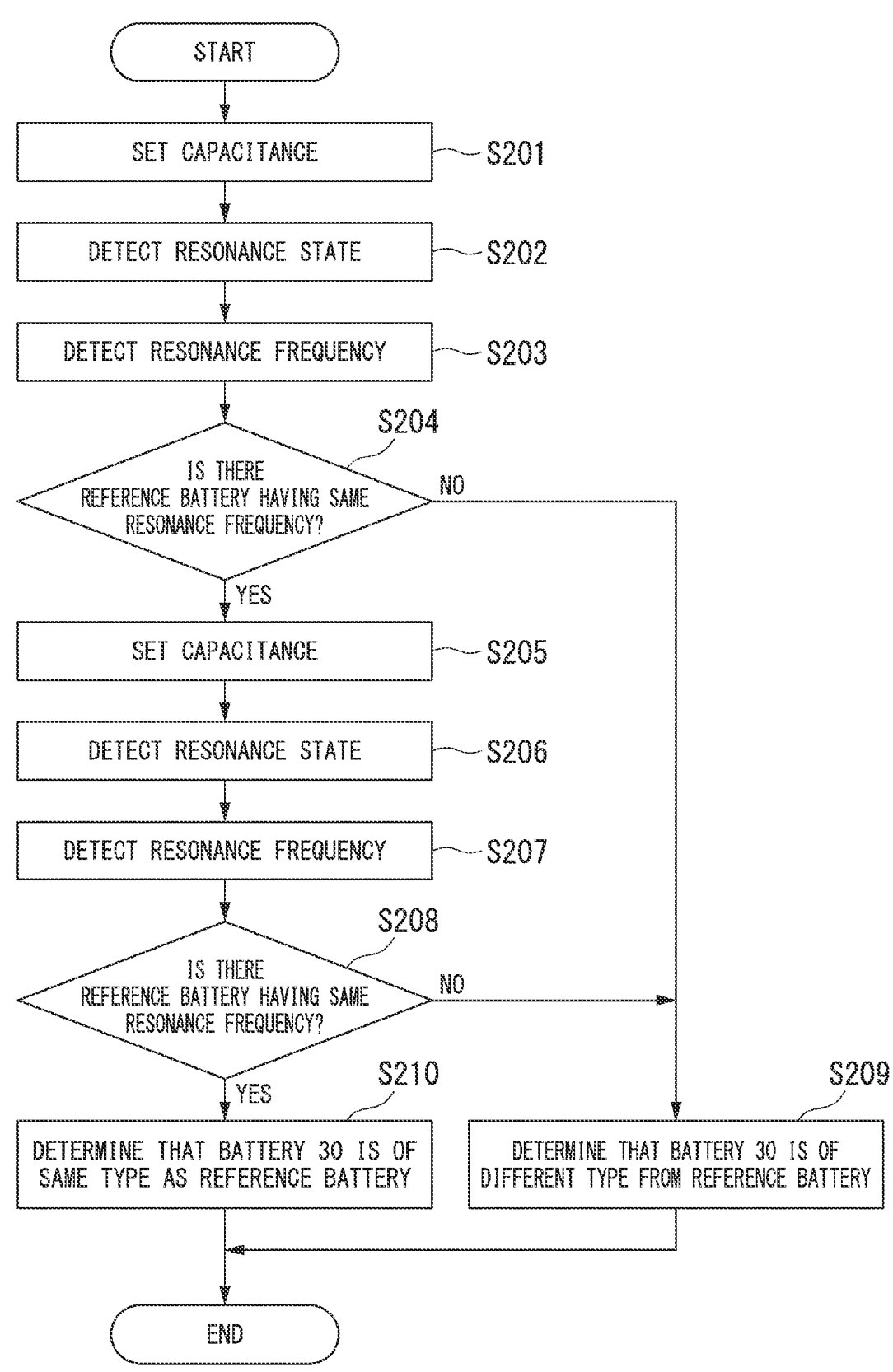
FIG. 7 is a flowchart showing an operation example of the battery type determination device according to the first embodiment.

FIG. 7 is a flowchart showing an operation example of the battery type determination device 20 according to the first embodiment. First, the control unit 26 sets the capacitance of the capacitor circuit 12 (step S201). After that, the resonance state detection unit 21 detects the resonance state of the electric circuit 10 (step S202). The resonance frequency detection unit 22 detects the resonance frequency (step S203). The determination unit 24 determines whether or not there is a reference battery that corresponds to the capacitance and has the same resonance frequency (step S204). In a case in which there is no reference battery having the same resonance frequency, the determination unit 24 determines that the battery 30 is of a different type from the reference battery (step S209) and terminates the operation. In a case in which there is a reference battery having the same resonance frequency, the control unit 26 newly sets the capacitance of the capacitor circuit 12 (step S205). After that, as in steps S202 to S204, the resonance state detection unit 21 detects the resonance state of the electric circuit 10 (step S206), the resonance frequency detection unit 22 detects the resonance frequency (step S207), and the determination unit 24 determines whether or not there is a reference battery that corresponds to the capacitance and has the same resonance frequency (step S208). In a case in which there is no reference battery having the same resonance frequency, the determination unit 24 determines that the battery 30 is of a different type from the reference battery (step S209) and terminates the operation. In a case in which there is a reference battery having the same resonance frequency, it determines that the battery 30 is of the same type as the reference battery (step S210).

The battery type determination device 20 described above detects the resonance state by changing the capacitance of the capacitor circuit 12 once, but may detect the resonance state by changing the capacitance two or more times to determine the resonance frequency in each case.

As described above, the battery type determination device 20 can determine the battery type.

Second Embodiment

Figure 8:
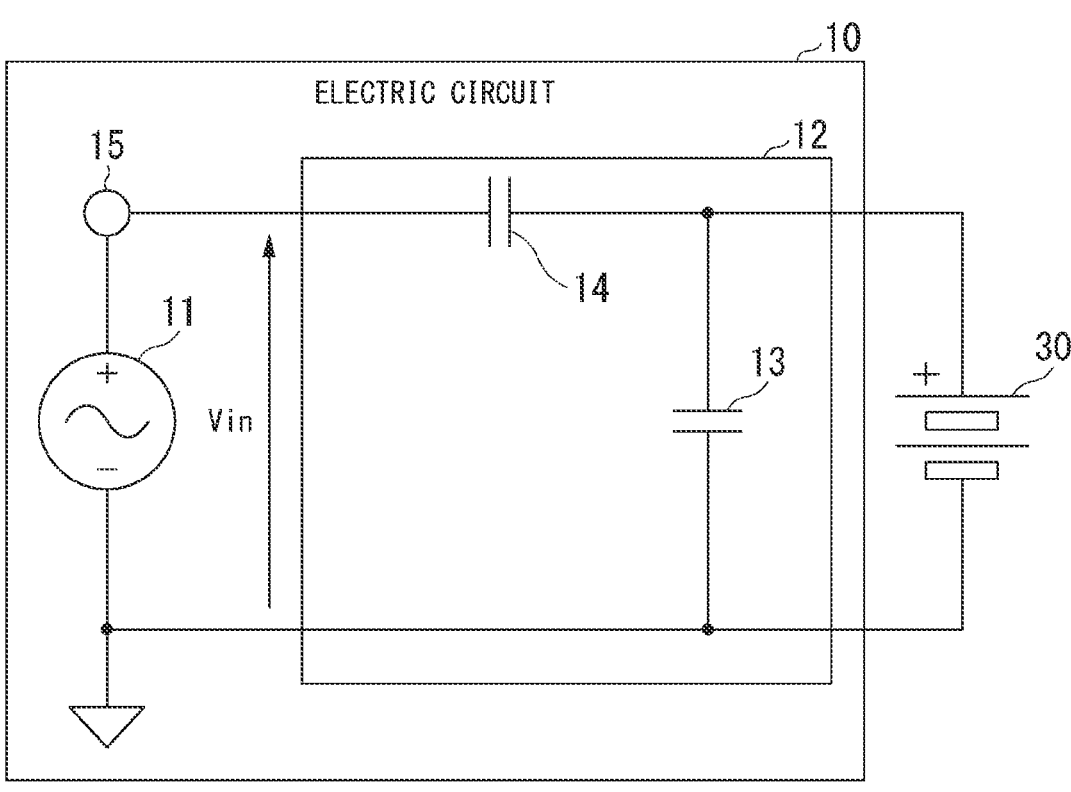
FIG. 8 is a diagram showing an example of an electric circuit according to a second embodiment.

FIG. 8 is a diagram showing an example of the electric circuit 10 according to a second embodiment. The capacitor circuit 12 according to the second embodiment is configured of a first capacitor 13 connected in parallel with the battery 30 with respect to the AC power supply 11, and a second capacitor 14 connected in series with the battery 30 and the first capacitor 13 with respect to the AC power supply 11.

In the second embodiment, the resonance frequency detection unit 22 detects two resonance frequencies. In a case in which the two resonance frequencies of the battery 30 and the reference battery coincide with each other, the determination unit 24 determines that the battery 30 is of the same type as the reference battery.

Figure 9:
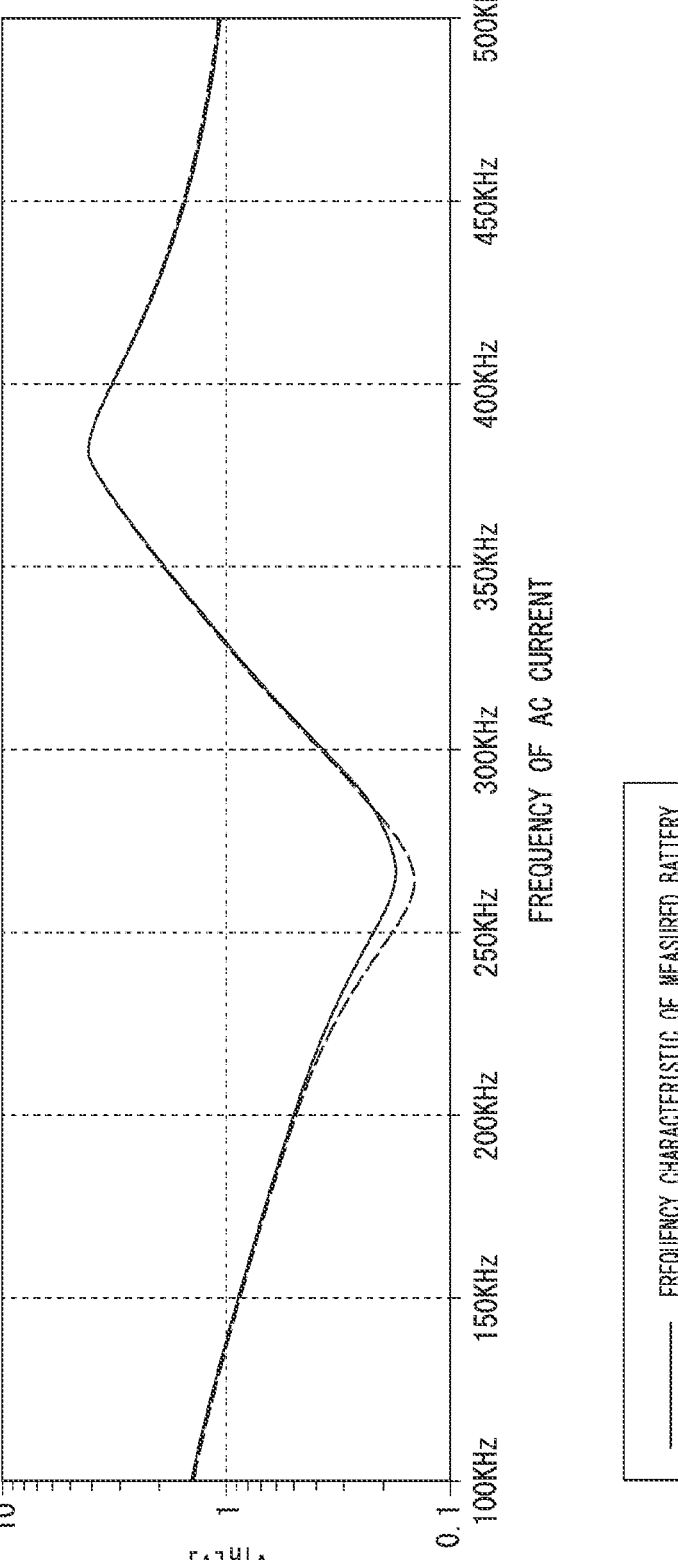
FIG. 9 is a diagram showing a frequency characteristic of a measured battery and a frequency characteristic of a reference battery.

FIG. 9 is a diagram showing a frequency characteristic of the measured battery 30 and a frequency characteristic of the reference battery. Here, the battery 30 is a simulated circuit in which one resonance frequency coincides therewith. That is, the graph shown in FIG. 8 is for the case in which a battery different from the reference battery is connected to the electric circuit 10.

In the graph shown in FIG. 9, one resonance frequency does not coincide therewith. Accordingly, the determination unit 24 determines that the battery 30 (simulated circuit) is of a different type from the reference battery.

Third Embodiment

Figure 10:
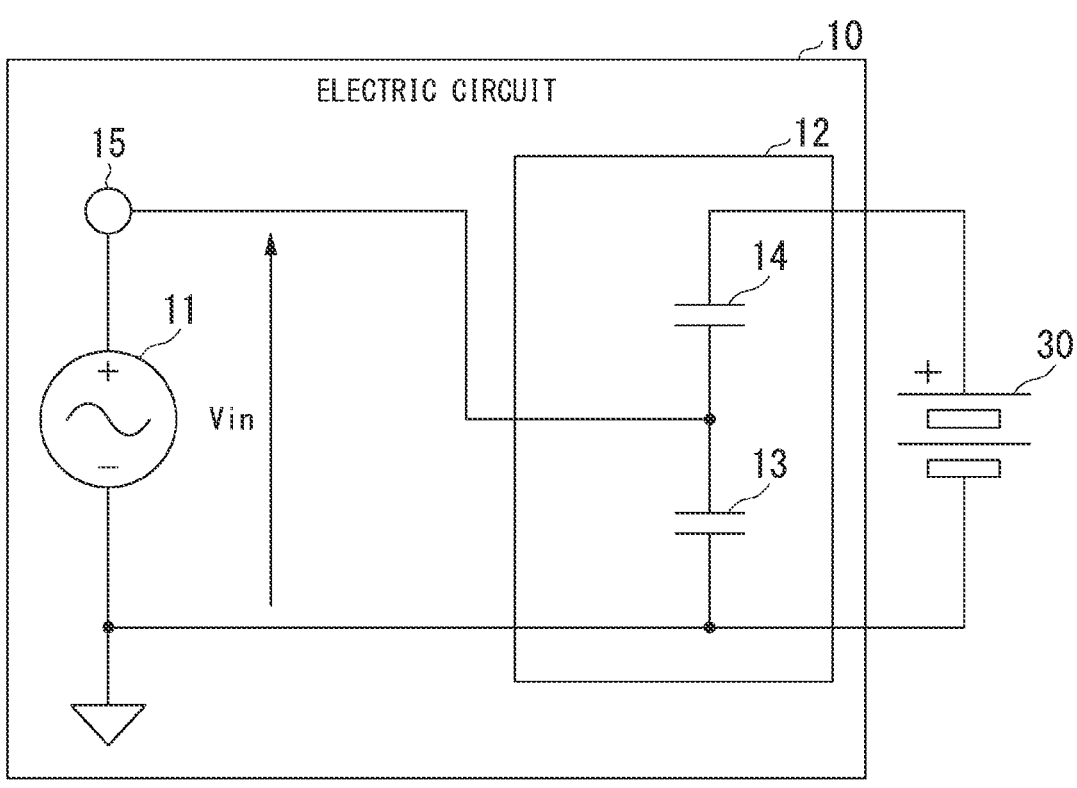
FIG. 10 is a diagram showing an example of an electric circuit according to a third embodiment.

FIG. 10 is a diagram showing an example of the electric circuit 10 according to a third embodiment. The capacitor circuit 12 according to the third embodiment is configured of the first capacitor 13 connected in parallel with the battery 30 with respect to the AC power supply 11, and the second capacitor 14 connected in series with the battery 30 to the AC power supply 11 and connected in parallel with the first capacitor 13.

In the third embodiment, the resonance frequency detection unit 22 detects two resonance frequencies. When the two resonance frequencies of the battery 30 and the reference battery coincide with each other, the determination unit 24 determines that the battery 30 is of the same type as the reference battery.

Figure 11:
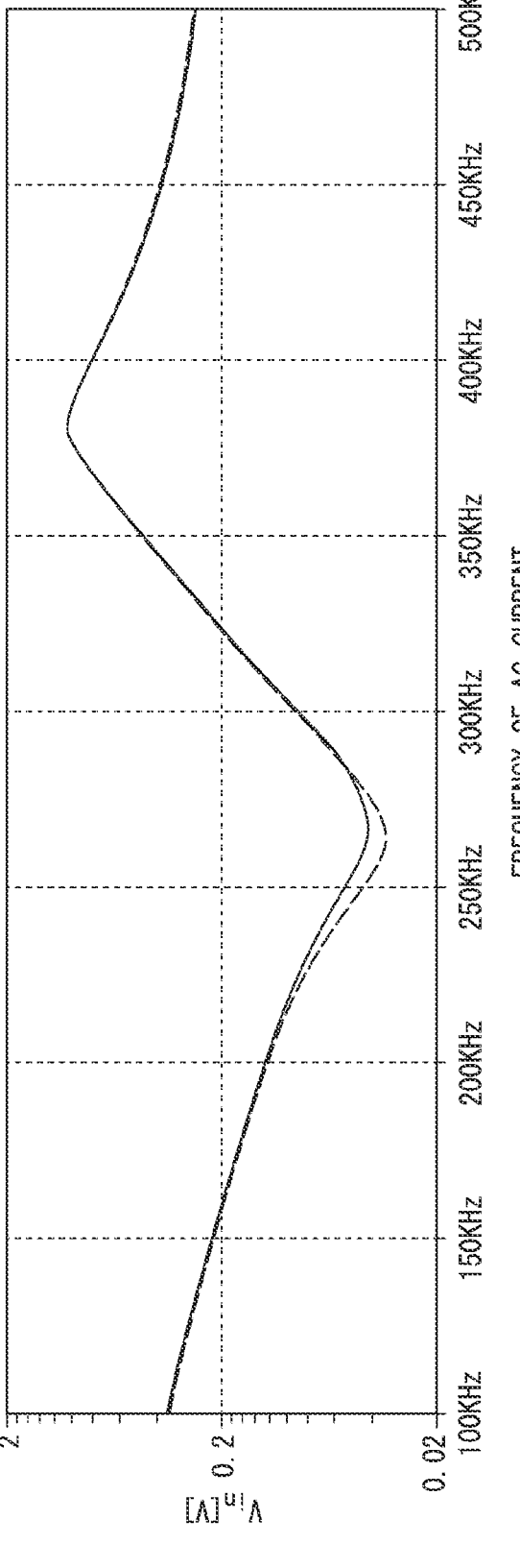
FIG. 11 is a diagram showing a frequency characteristic of a measured battery and a frequency characteristic of a reference battery.

FIG. 11 is a diagram showing a frequency characteristic of the measured battery 30 and a frequency characteristic of the reference battery. Here, the battery 30 is a simulated circuit in which one resonance frequency coincides therewith. That is, the graph shown in FIG. 8 is for the case in which a battery different from the reference battery is connected to the electric circuit 10.

In the graph shown in FIG. 11, one resonance frequency does not coincide therewith. Accordingly, the determination unit 24 determines that the battery 30 (simulated circuit) is of a different type from the reference battery.

Fourth Embodiment

Figure 12:
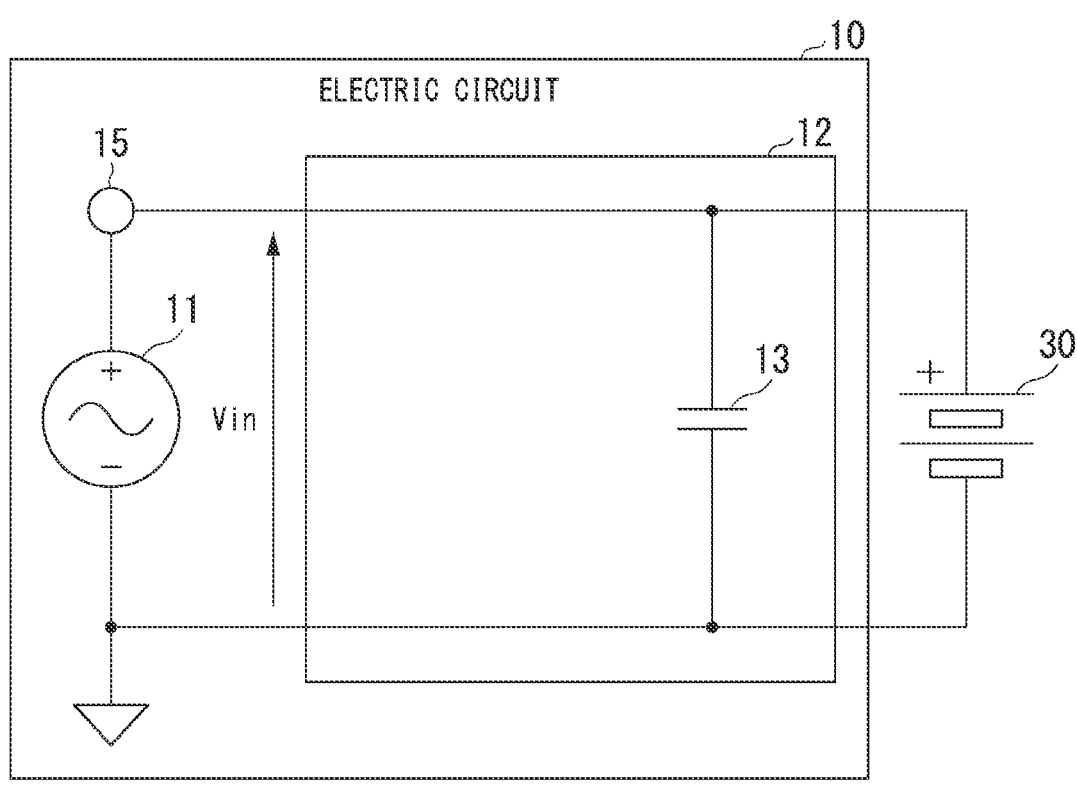
FIG. 12 is a diagram showing an example of an electric circuit according to a fourth embodiment.

FIG. 12 is a diagram showing an example of the electric circuit 10 according to a fourth embodiment. The capacitor circuit 12 according to the fourth embodiment is configured of the first capacitor 13 connected in parallel with the battery 30 to the AC power supply 11.

In the fourth embodiment, the resonance frequency detection unit 22 detects one resonance frequency. The determination unit 24 determines that the battery 30 is of the same type as the reference battery in a case in which one resonance frequency of the battery 30 and the reference battery is the same.

Figure 13:
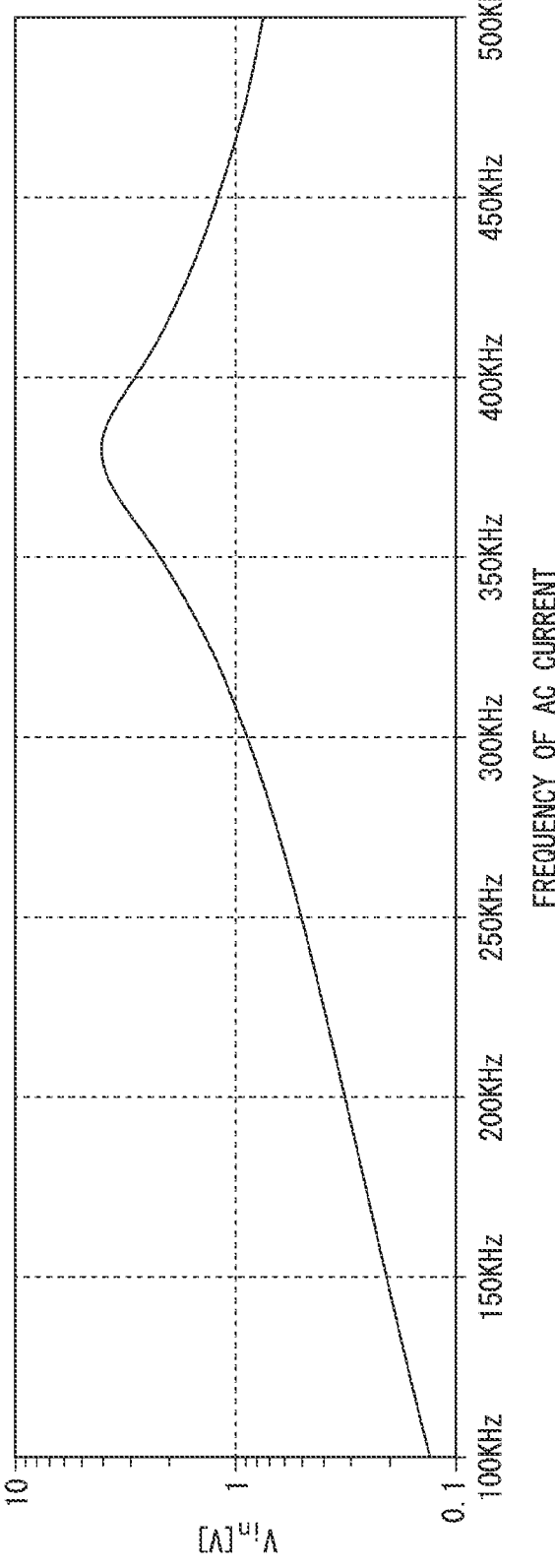
FIG. 13 is a diagram showing a frequency characteristic of a measured battery.

FIG. 13 is a diagram showing a frequency characteristic of the measured battery 30. In the fourth embodiment, one resonance frequency is detected.

Unlike the battery type determination system 1 in the fourth embodiment, the battery type determination systems 1 according to the first to third embodiments detect a plurality of resonance frequencies and determine the battery type on the basis of the plurality of resonance frequencies. Thus, the battery type can be determined with higher accuracy.

The embodiments described above can be expressed as follows.

A battery type determination device which includes:

a storage device that stores a program; and a hardware processor, and which is configured to: detect at least one resonance state generated by an inductance component of a battery and a capacitance component of a capacitor circuit in response to an AC signal output from an AC power supply from an electric circuit, which includes the AC power supply that is connected to the battery and has a variable frequency, and a capacitor circuit that is configured of at least one capacitor and provided between the battery and the AC power supply;

detect a resonance frequency in the resonance state;

using the resonance frequency as a resonance characteristic of the battery; and determine whether or not the battery is of the same type as a reference battery by comparing the resonance characteristic of the battery with a reference resonance characteristic of the reference battery serving as a reference for the battery.

As described above, the aspects for carrying out the present invention have been described using the embodiments, but the present invention is not limited to such embodiments at all, and various modifications and substitutions can be made without departing from the gist of the present invention.

What is claimed is:

1. A battery type determination system comprising:

an AC power supply configured to output a variable-frequency AC signal; and a capacitor circuit including a first capacitor connected in parallel with a battery and a second capacitor connected in series with the battery, the capacitor circuit including a variable capacitance realized by selectively connecting one or more capacitors via switches;

a resonance state detector configured to detect at least one resonance state based on a peak of a resonance current or a resonance voltage caused by an inductance component of the battery and a capacitance component of the capacitor circuit in response to the AC signal;

a resonance characteristic detector configured to detect a resonance frequency for each of a plurality of capacitance values of the capacitor circuit and to generate a resonance-characteristic vector comprising the detected frequencies; and a determination unit configured to determine whether the battery is of a same type as a reference battery by comparing the resonance-characteristic vector with a reference resonance characteristic stored in a calibrated database and using a predetermined threshold-based decision rule.

2. The battery type determination system according to claim 1, further comprising:

a resonance current detection unit that detects a magnitude of a resonance current, which is a current when a frequency of the AC signal is the resonance frequency, with respect to an AC voltage of the AC signal, and the resonance characteristic detection unit uses the resonance current as the resonance characteristic of the battery.

3. The battery type determination system according to claim 1, further comprising:

a resonance voltage detection unit that detects a magnitude of a resonance voltage, which is a voltage when the frequency is the resonance frequency, with respect to the AC voltage of the AC signal, and the resonance characteristic detection unit uses the resonance voltage as the resonance characteristic of the battery.

4. The battery type determination system according to claim 1, wherein the capacitor circuit comprises a variable capacitor having a variable capacitance, and the determination unit determines whether or not the battery is of the same type as the reference battery by comparing the resonance characteristic of the battery for each different capacitance of the variable capacitor with the reference resonance characteristic of the reference battery.

5. The battery type determination system according to claim 4, wherein the variable capacitor comprises capacitors connected in parallel with each other and switches connected to the capacitors.

6. The battery type determination system according to claim 1, wherein the capacitor circuit is configured of a first capacitor connected in parallel with the battery with respect to the AC power supply and a second capacitor connected in series with the battery and the first capacitor with respect to the AC power supply.

7. The battery type determination system according to claim 1, wherein the capacitor circuit is configured of a first capacitor connected in parallel with the battery with respect to the AC power supply and a second capacitor connected in series with the battery with respect to the AC power supply and connected in parallel with the first capacitor.

8. A method for determining a battery type comprising:

outputting a variable-frequency AC signal;

a resonance state detecting step of detecting at least one resonance state based on a peak of a resonance current or a resonance voltage caused by an inductance component of a battery and a capacitance component of a capacitor circuit in response to the AC signal, the capacitor circuit including a first capacitor connected in parallel with a battery and a second capacitor connected in series with the battery, the capacitor circuit including a variable capacitance realized by selectively connecting one or more capacitors via switches;

a resonance characteristic detecting step of detecting a resonance frequency for each of a plurality of capacitance values of the capacitor circuit and generating a resonance-characteristic vector comprising the detected frequencies; and a determining step of determining whether the battery is of a same type as a reference battery by comparing the resonance-characteristic vector with a reference resonance characteristic stored in a calibrated database and using a predetermined threshold-based decision rule.

9. A computer-readable non-transitory storage medium which stores a program that causes a computer to execute:

detecting at least one resonance state based on a peak of a resonance current or a resonance voltage caused by an inductance component of a battery and a capacitance component of a capacitor circuit in response to a variable-frequency AC signal, the capacitor circuit including a first capacitor connected in parallel with a battery and a second capacitor connected in series with the battery, the capacitor circuit including a variable capacitance realized by selectively connecting one or more capacitors via switches;

detecting a resonance frequency for each of a plurality of capacitance values of the capacitor circuit and generating a resonance-characteristic vector comprising the detected frequencies; and determining whether the battery is of a same type as a reference battery by comparing the resonance-characteristic vector with a reference resonance characteristic stored in a calibrated database and using a predetermined threshold-based decision rule.

* * * * *